(12) United States Patent
Yang

(10) Patent No.: US 12,707,852 B2
(45) Date of Patent: Aug. 11, 2026

(54) DISPLAY DEVICE

(71) Applicant: Samsung Display Co., Ltd., Yongin-si (KR)

(72) Inventor: Jiseong Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 375 days.

(21) Appl. No.: 18/453,855

(22) Filed: Aug. 22, 2023

(65) Prior Publication Data

US 2024/0107847 A1 Mar. 28, 2024

(30) Foreign Application Priority Data

Sep. 27, 2022 (KR) ........................ 10-2022-0122281

(51) Int. Cl.
*H10K 59/38* (2023.01)
*H10K 59/80* (2023.01)

(52) U.S. Cl.
CPC ........... *H10K 59/38* (2023.02); *H10K 59/873* (2023.02)

(58) Field of Classification Search
CPC ...................................................... H10K 59/38
USPC .................................................. 313/498–512
See application file for complete search history.

(56) References Cited

U.S. PATENT DOCUMENTS

| | | | |
|---|---|---|---|
| 10,923,538 B2 | 2/2021 | Lee et al. | |
| 11,322,553 B2 | 5/2022 | Song et al. | |
| 11,552,139 B2 | 1/2023 | Kim et al. | |
| 2021/0104578 A1* | 4/2021 | Jo | H10K 50/115 |
| 2021/0143222 A1* | 5/2021 | Song | H10K 59/38 |
| 2021/0359009 A1 | 11/2021 | Lee et al. | |
| 2021/0384467 A1 | 12/2021 | Park et al. | |
| 2022/0077239 A1* | 3/2022 | Kim | G02F 1/133512 |

FOREIGN PATENT DOCUMENTS

| | | |
|---|---|---|
| KR | 10-2020-0100910 A | 8/2020 |
| KR | 10-2021-0057273 A | 5/2021 |
| KR | 10-2021-0135971 A | 11/2021 |
| KR | 10-2021-0142031 A | 11/2021 |
| KR | 10-2021-0151302 A | 12/2021 |
| KR | 10-2021-0152102 A | 12/2021 |

* cited by examiner

*Primary Examiner* — Christopher M Raabe
(74) *Attorney, Agent, or Firm* — Womble Bond Dickinson (US) LLP

(57) ABSTRACT

Provided is a display device comprising a first base substrate, a display element layer which is located on the first base substrate and in which a plurality of light-emitting regions arranged in a first direction are defined, an encapsulation layer located on the display element layer, a light control layer located on the encapsulation layer and comprising light control parts located in a one-to-one correspondence with the light-emitting regions, a filling layer located on the light control layer, and a second base substrate located on the filling layer, wherein when viewed on a plane, at least one control part of the light control parts comprises a first portion, and a second portion extending from one side of the first portion in a second direction perpendicular to the first direction, the second portion having a smaller width than the first portion in the first direction.

18 Claims, 7 Drawing Sheets

DD
OP
DP
CFL
CCL
DP-ED
DP-CL
BS
BL
LR
TFE
OH
PDL
NPXA
PXA-B
NPXA
PXA-G
NPXA
NPXA-R
PXA-R
NPXA
CCP3
CF3
BW-OH3
EA3
CCP2
CF2
BW-OH2
EA2
S-CCP12
CCP1
S-CCP11
CF1
BW-OH1
EA1
EL1 HTR EML3 ETR EL2
EMD3
EL1 HTR EML2 ETR EL2
EMD2
EL1 HTR EML1 ETR EL2
EMD1
FML
CAP-T
BMP
CAP
II
II'
DR1
DR2
DR3

DD
OP
DP
CFL
CCL
DP-ED
DP-CL
BS
BL
LR
TFE
OH
PDL
NPXA
PXA-B
PXA-G
NPXA-G
PXA-R
CCP3
CF3
BW-OH3
EA3
CCP1
S-CCP21
S-CCP22
CF2
BW-OH2
EA2
CF1
BW-OH1
EA1
EL1 HTR EML3 ETR EL2
EMD3
EL1 HTR EML2 ETR EL2
EMD2
EL1 HTR EML1 ETR EL2
EMD1
FML
CAP-T
BMP
CAP
II
II'
DR1
DR2
DR3

DISPLAY DEVICE

CROSS-REFERENCE TO RELATED APPLICATION

This application claims priority to, and the benefit of, Korean Patent Application No. 10-2022-0122281, filed on Sep. 27, 2022, the entire contents of which are hereby incorporated by reference.

BACKGROUND

The present disclosure herein relates to a display device including a light control layer.

In general, a display device includes a plurality of pixels for displaying images. Pixels each include a light-emitting element located in a pixel region, and a driving element located around the pixel region. The driving element drives the light-emitting element, and the light-emitting element generates light (e.g., predetermined light), which enables images to be displayed.

Recently, a display device including light control layers is being developed to improve color purity. The light control layers are located on pixels, and convert light generated in the pixels into light having a different wavelength. Light conversion layers are located to respectively overlap corresponding pixels among pixels. The light conversion layers each contain quantum dots for converting the wavelength of light.

SUMMARY

The present disclosure provides a display device having an improved display quality, and a reduced manufacturing time.

One or more embodiments of the present disclosure provide

In one or more embodiments of the present disclosure, a display device includes

In one or more embodiments of the present disclosure, a display device including first to third pixel regions alternately arranged in a first direction, the display device may include

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain aspects of the present disclosure. In the drawings.

DETAILED DESCRIPTION

Figure 1:
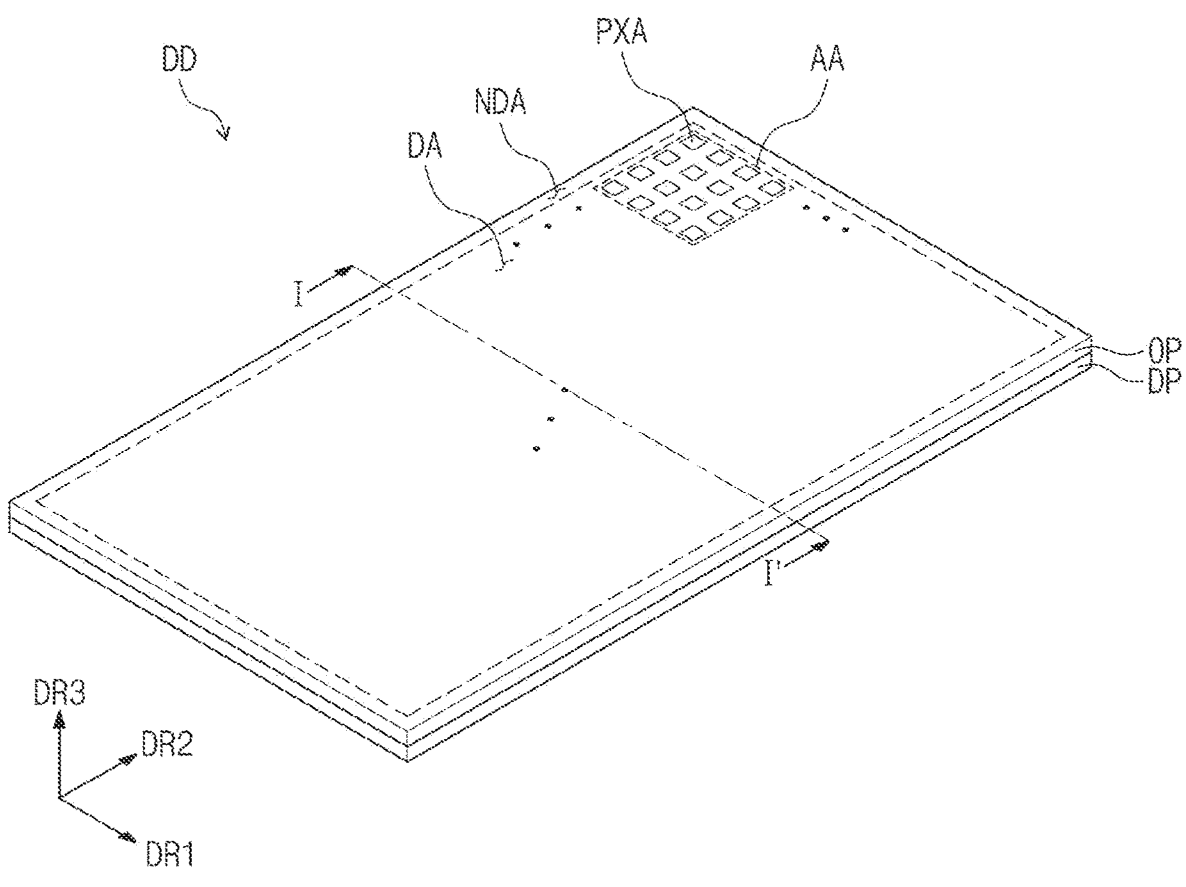
FIG. 1 is a perspective view of a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" and "at least one of A or B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a display device according to one or more embodiments will be explained with reference to drawings.

Figure 2:
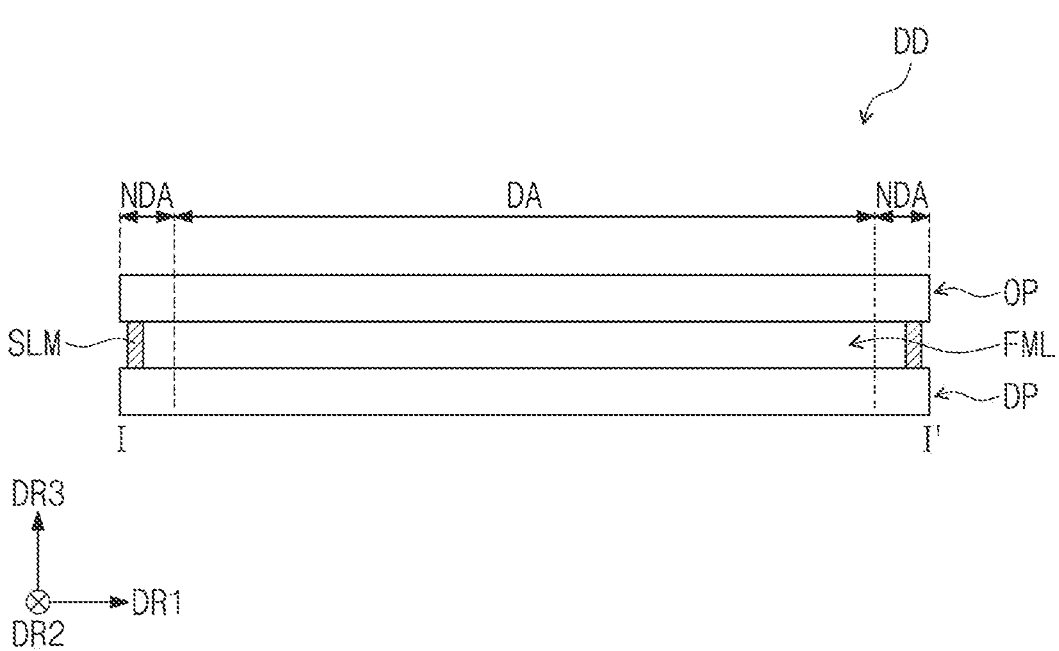
FIG. 2 is a cross-sectional view of a display device according to one or more embodiments.

FIG. 1 is a perspective view of a display device according to one or more embodiments. FIG. 2 is a cross-sectional view of a display device according to one or more embodiments. FIG. 2 is a cross-sectional view schematically illustrating a portion taken along the line I-I' of FIG. 1.

A display device DD according to one or more embodiments may be activated in response to an electrical signal. For example, the display device DD may be a mobile phone, a tablet PC, a vehicle navigation unit, a game console, or a wearable device, but the present disclosure is not limited thereto.

Hereafter, a first direction axis DR1 to a third direction axis DR3 are illustrated, and the directions indicated by the first to the third direction axes DR1, DR2, and DR3 described herein have relative concepts, and thus may be changed to other directions. Also, directions indicated by the first to third direction axes DR1, DR2, and DR3 may be described as the first to third directions, and thus denoted as the same reference numerals or symbols.

In this specification, a thickness direction of the display device DD may be parallel to the third direction axis DR3 that is the normal direction of the plane defined by the first direction axis DR1 and the second direction axis DR2. In this specification, a front surface (or upper surface) and a rear surface (or lower surface) of each member constituting the display device DD may be defined with respect to the third direction axis DR3.

The display device DD may include a display region DA, and a non-display region NDA adjacent to the display region DA. The display region DA may be a region in which the image is displayed. A plurality of pixel regions PXA may be arranged in the display region DA. The plurality of pixel regions PXA may include first to third pixel regions PXA-R, PXA-G, and PXA-B (see FIG. 3) that respectively emit light having respective wavelength ranges.

In one or more embodiments, the display region DA may have a quadrilateral shape. The non-display region NDA may surround the display region DA. However, the present disclosure is not limited thereto, and the shape of the display region DA and the shape of the non-display region NDA may be relatively designed. In addition, the non-display region NDA may be omitted from the display surface that is the front surface of the display device DD.

Figure 5A:
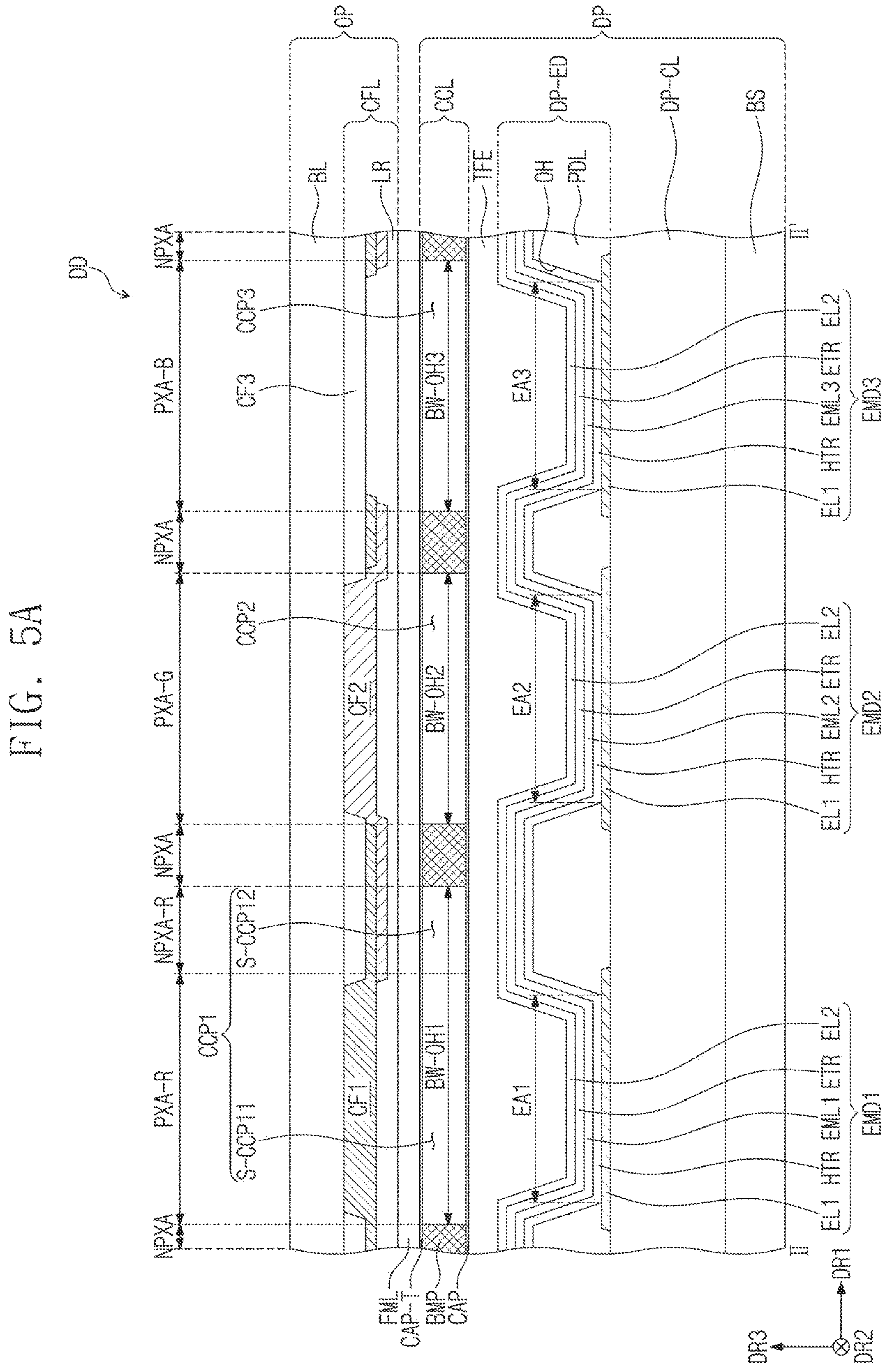
FIG. 5A is a cross-sectional view of a part of a display device according to one or more embodiments.

The display device DD according to one or more embodiments may include a lower panel DP including a display element layer DP-ED (see FIG. 5A), and may include an upper panel OP including a color filter layer CFL (see FIG. 5A). In one or more embodiments, a filling layer FML may be located between the lower panel DP and the upper panel OP.

In the display device DD according to one or more embodiments, the filling layer FML may be filled between the lower panel DP and the upper panel OP. The filling layer FML may be located on the light control layer CCL. The filling layer FML may function as a buffer between the lower panel DP and the upper panel OP. In one or more embodiments, the filling layer FML may function to absorb a shock, and may enable the display device DD to be strengthened. The filling layer FML may be formed of a filling resin containing a polymer resin. For example, the filling layer FML may be formed of a filling layer resin including an acrylic resin or an epoxy-based resin and the like.

Meanwhile, in one or more embodiments, the filling layer FML may be omitted, and the upper panel OP may be directly located on the lower panel DP. For example, in one or more embodiments, the filling layer FML may be omitted, and a color filter layer CFL (see FIG. 5A) may be located on the lower panel DP.

Referring back to FIG. 2, the display device DD according to one or more embodiments may include an encapsulation portion SLM located between the lower panel DP and the upper panel OP. The lower panel DP and the upper panel OP may be bonded through the encapsulation portion SLM. The encapsulation portion SLM may be located in the non-display region NDA, and may bond the lower panel DP and the upper panel OP to each other. The encapsulation portion SLM may be located in the non-display region NDA, which is the outer part of the display device DD, and may reduce or prevent foreign substances, oxygen, moisture and like from entering the display device DD from the outside. The encapsulation portion SLM may be formed from a sealant including a curable resin. The sealant may include an epoxy-based resin or an acrylic resin. The sealant may be a thermosetting material or a photocurable material. The sealant may be provided on one surface of the lower panel DP or the upper panel OP, and then, the lower panel DP and the upper panel OP may be attached to face each other. After that, the sealant may be cured by heat or ultraviolet light to form the encapsulation portion SLM.

Figure 3:
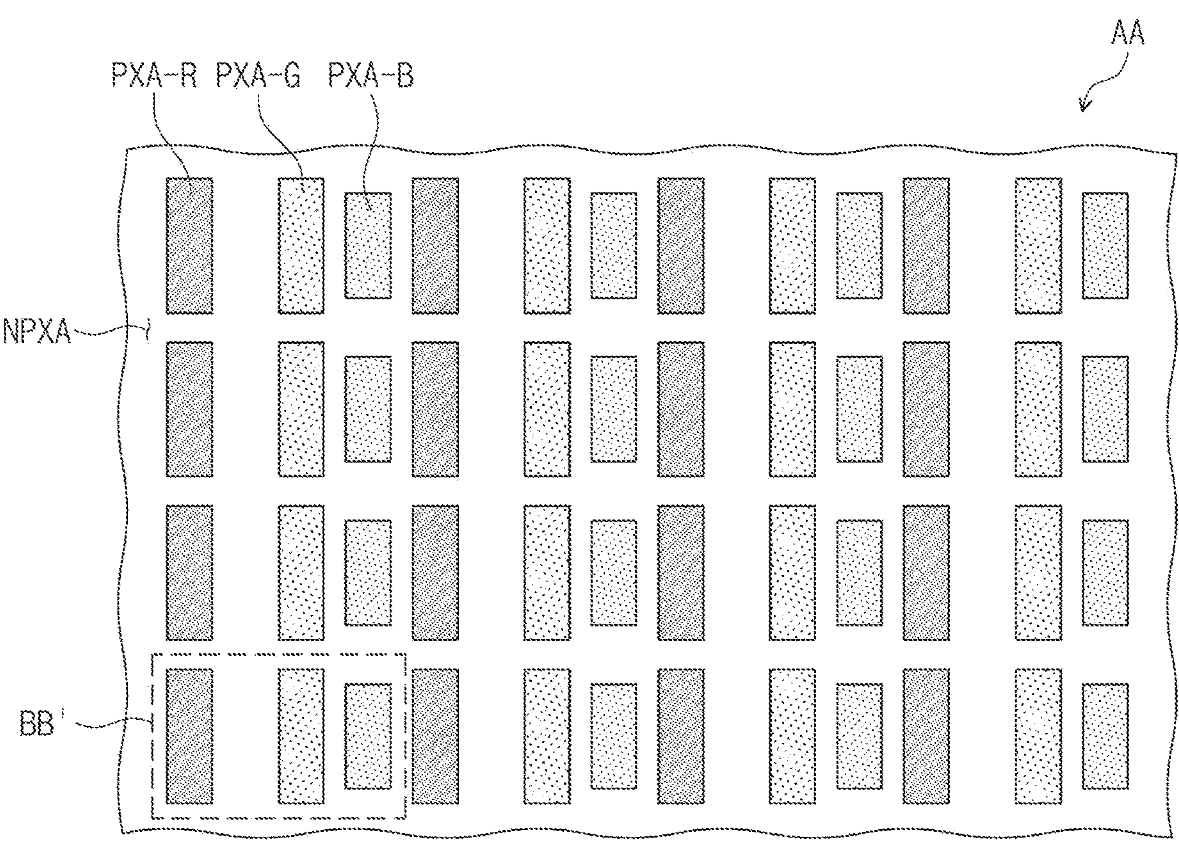
FIG. 3 is a plan view of a part of a display device according to one or more embodiments.
Figure 3:
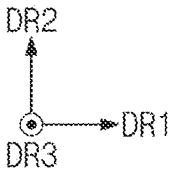
Figure 4:
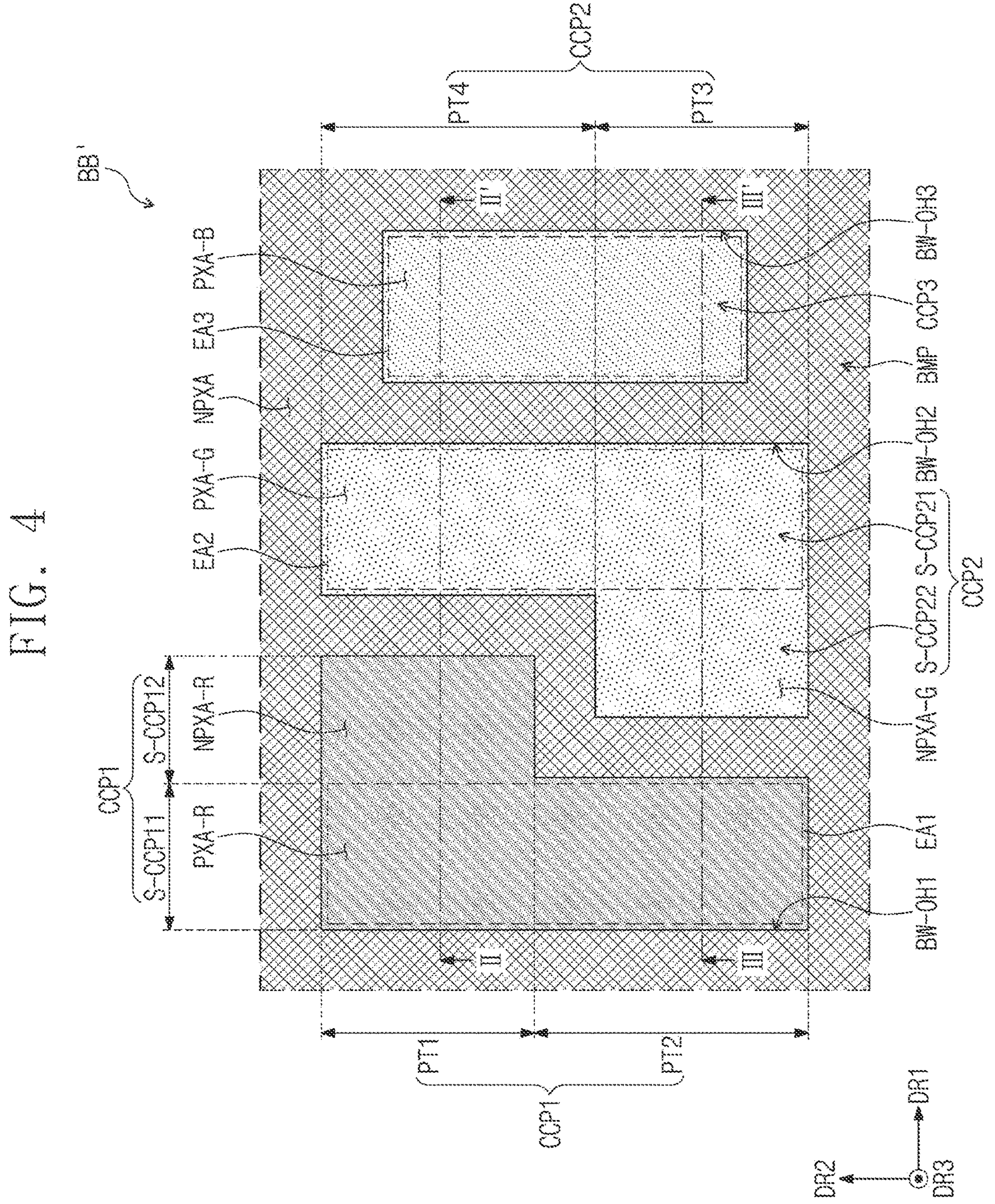
FIG. 4 is a plan view of a part of a display device according to one or more embodiments.

FIG. 3 is a plan view of a part of a display device according to one or more embodiments, and illustrates a portion corresponding to AA illustrated in FIG. 1. FIG. 4 is a plan view of a part of a display device according to one or more embodiments, and illustrates a portion of corresponding to BB illustrated in FIG. 3. FIG. 5A is a cross-sectional view of a part of a display device according to one or more embodiments.

Figure 5B:
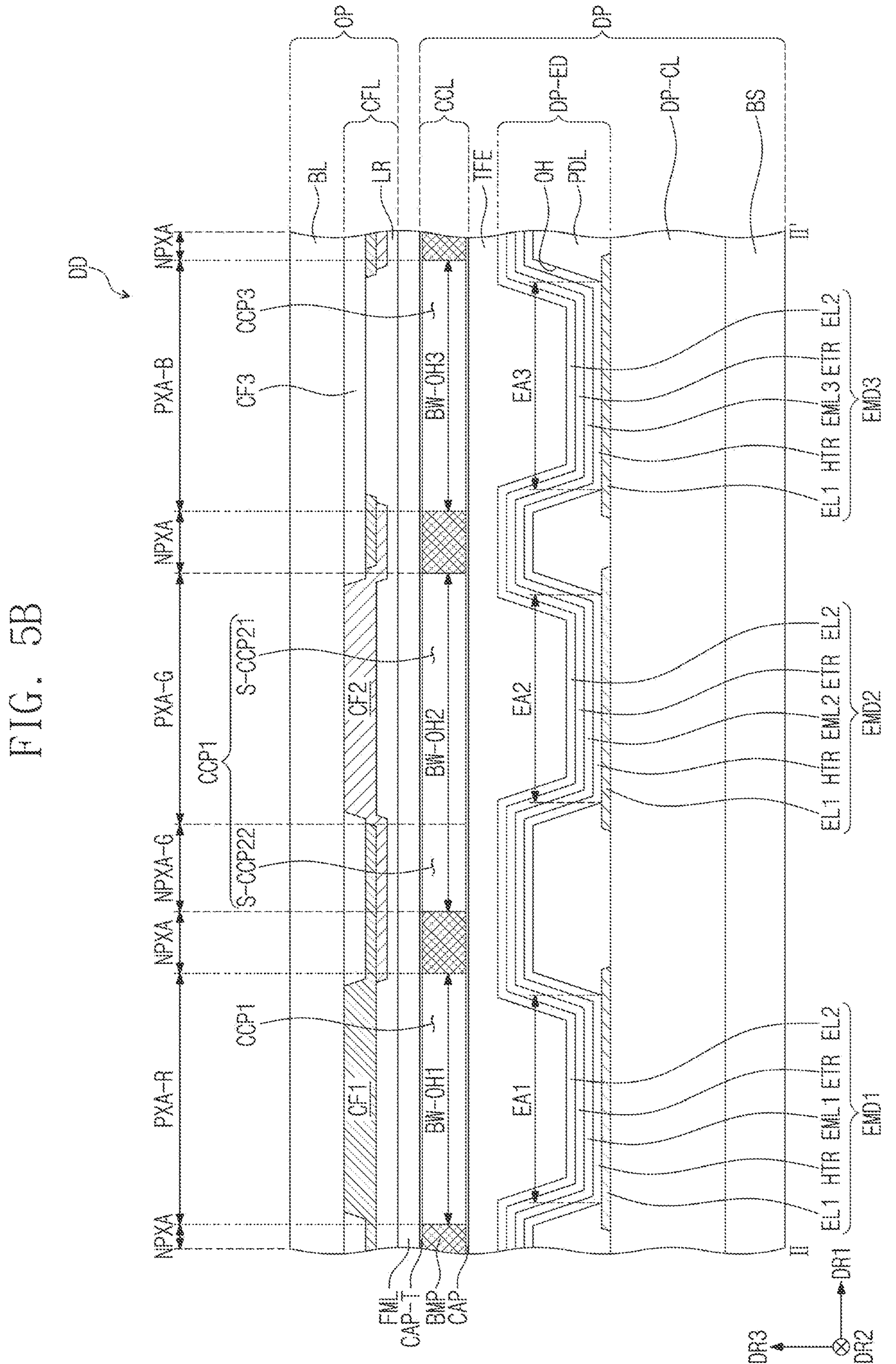
FIG. 5B is a cross-sectional view of a part of a display device according to one or more embodiments.
Figure 6:
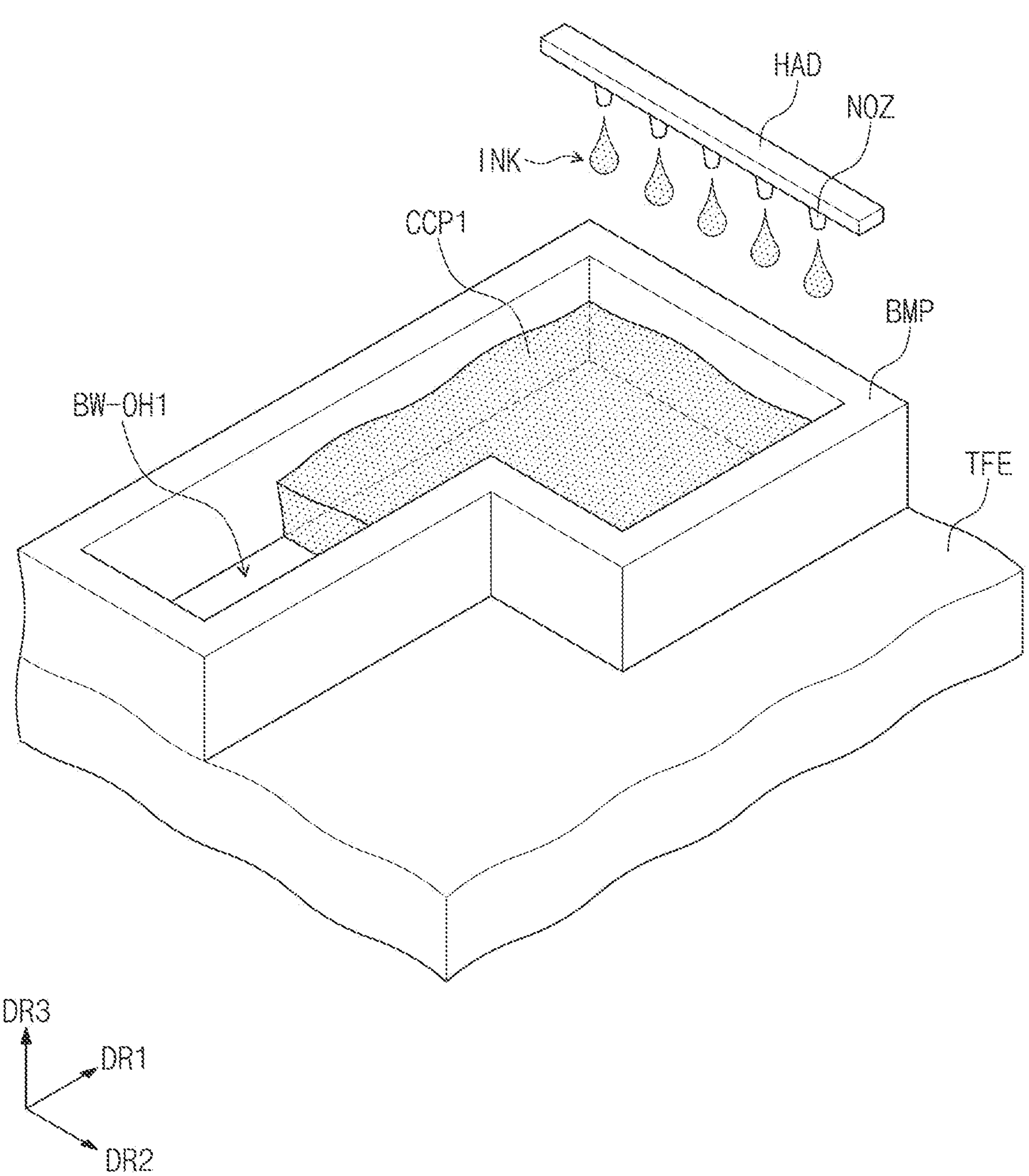
FIG. 6 is a view schematically illustrating an operation of a method of manufacturing a display device according to one or more embodiments.

FIG. 5A may be a cross section of a portion taken along the line II-II' illustrated in FIG. 4. FIG. 5B is a cross-sectional view of a part of a display device according to one or more embodiments. FIG. 5B may be a cross section of a portion taken along the line III-III' illustrated in FIG. 4. Meanwhile, in FIG. 4, to explain a relationship between a light control layer and a display element layer on a plane, components located above the light control layer are omitted. FIG. 6 is a view schematically illustrating an operation of a method of manufacturing a display device according to one or more embodiments. FIG. 6 is a view schematically illustrating an operation of forming a light control part in one or more embodiments.

Referring to FIG. 3 and FIG. 5A, the display device DD according to one or more embodiments may include a peripheral region NPXA and pixel regions PXA-R, PXA-G, and PXA-B. The pixel regions PXA-R, PXA-G, and PXA-B may be spaced apart from each other on a plane. For example, the pixel regions PXA-R, PXA-G, and PXA-B may be alternately arranged in the first direction DR1. The pixel regions PXA-R, PXA-G, and PXA-B may have a stripe-like shape.

The first to third pixel regions PXA-R, PXA-G, and PXA-B may each have a rectangular shape on a plane. The first to third pixel regions PXA-R, PXA-G, and PXA-B may each have a shape in which a side extending in the first direction DR1 is shorter than a side extending in the second direction DR2. FIG. 3 illustrates the display device DD including the first to third pixel regions PXA-R, PXA-G, and PXA-B, which have the same planar shape, and at least one of which has a planar area that is different from the others, but the present disclosure is not limited thereto. The first to third pixel regions PXA-R, PXA-G, and PXA-B may all have the same area. The areas of the first to third pixel regions PXA-R, PXA-G, and PXA-B may be set according to the color of light emitted.

The display device DD according to one or more embodiments may include the plurality of pixel regions PXA-R, PXA-G, and PXA-B. For example, the display device DD according to one or more embodiments may include a first pixel region PXA-R, a second pixel region PXA-G, and a third pixel region PXA-B that are separated from each other. The first pixel region PXA-R, the second pixel region PXA-G, and the third pixel region PXA-B may respectively emit light having different respective wavelength ranges. For example, in one or more embodiments, the first pixel region PXA-R may be a red light-emitting region that emits red light, the second pixel region PXA-G may be a green light-emitting region that emits green light, and the third pixel region PXA-B may be a blue light-emitting region that emits blue light. However, the present disclosure is not limited thereto, and the plurality of the pixel regions PXA-R, PXA-G, and PXA-B may include three groups of pixel regions displaying three primary colors that instead may be yellow, magenta, and cyan.

The pixel regions PXA-R, PXA-G, and PXA-B according to one or more embodiments may be repeatedly arranged throughout the display region DA (see FIG. 1). When viewed on a plane, the first to third pixel regions PXA-R, PXA-G, and PXA-B may not overlap each other, and may be separated from each other. The peripheral region NPXA is located around the first to third pixel regions PXA-R, PXA-G, and PXA-B. The peripheral region NPXA sets boundaries of the first to third pixel regions PXA-R, PXA-G, and PXA-B. The peripheral region NPXA may surround the first to third pixel regions PXA-R, PXA-G, and PXA-B. In the peripheral region NPXA, a structure for reducing or preventing color-mixing between the first to third pixel regions PXA-R, PXA-G, and PXA-B, for example, a pixel-defining film PDL or division patterns BMP, etc., may be located.

Referring to FIG. 4 to FIG. 6, the lower panel DP according to one or more embodiments may include a first base substrate BS, a circuit layer DP-CL located on the first base substrate BS, and a display element layer DP-ED, an encapsulation layer TFE, and a light control layer CCL, which are located on the circuit layer DP-CL. The display element layer DP-ED may include a pixel-defining film PDL and light-emitting elements EMD1, EMD2, and EMD3. The encapsulation layer TFE may cover an upper part of the display element layer DP-ED. The encapsulation layer TFE may be filled between the display element layer DP-ED and the light control layer CCL.

The lower panel DP of the display device DD according to one or more embodiments may be an emission-type display panel. For example, the lower panel DP may be an organic electroluminescence display panel. When the lower panel DP is an organic electroluminescence display panel, the display element layer DP-ED may include an organic electroluminescence element as the light-emitting element EMD. However, the present disclosure is not limited thereto. For example, the display element layer DP-ED may include a quantum dot light-emitting diode as the light-emitting element EMD. In addition, the display element layer DP-ED may include a micro LED element and/or a nano LED element, etc., as the light-emitting element EMD. The light-emitting element EMD may generate source light. Source light, generated from the light-emitting element EMD to be output, may be provided to the light control layer CCL, and the source light may be converted in the light control layer CCL into light having a different wavelength, or may be scattered and transmitted. Meanwhile, in the present specification, the light emitting element EMD may mean any one of the light emitting elements EMD1, EMD2, and EMD3.

In the lower panel DP, the first base substrate BS may be a member providing a base surface on which the display element layer DP-ED is located. The first base substrate BS may be a glass substrate, a metal substrate, a polymer substrate, or the like. However, the present disclosure is not limited thereto, and the first base substrate BS may include an inorganic layer, a functional layer, or a composite material layer.

The first base substrate BS may have a multi-layered structure. For example, the first base substrate BS may have a three-layered structure of a polymer resin layer, an adhesive layer, and a polymer resin layer. For example, the polymer resin layer may include a polyimide-based resin. Also, the polymer resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In this specification, a "~~based" resin may be considered as including a functional group of "~~".

The circuit layer DP-CL may be located on the first base substrate BS. The circuit layer DP-CL may include an insulating layer, a semiconductor pattern, a conductive pattern, a signal line, and the like. After an insulating layer, a semiconductor layer, and a conductive layer are formed on the first base substrate BS through coating, deposition, etc., the insulating layer, the semiconductor layer, and the conductive layer may be selectively patterned by performing a photolithography process multiple times. Thereafter, the semiconductor pattern, the conductive pattern, and the signal line included in the circuit layer DP-CL may be formed. In one or more embodiments, the circuit layer DP-CL may include a transistor, a buffer layer, and a plurality of insulating layers.

Referring to FIG. 5A or FIG. 5B, the light-emitting element EMD according to one or more embodiments may include a first electrode EL1, a second electrode EL2 facing the first electrode EL1, and a light-emitting layer EML located between the first electrode EL1 and the second electrode EL2. The light-emitting layer EML included in the light-emitting element EMD may include an organic light-emitting material or a quantum dot as a light-emitting material. The light-emitting element EMD may further include a hole control layer HTR and an electron control layer ETR. Meanwhile, in one or more embodiments, the light-emitting element EMD may further include a capping layer located above the second electrode EL2.

The pixel-defining film PDL may be located on the circuit layer DP-CL, and may cover a portion of the first electrode EL1. The pixel-defining film PDL has a light-emitting opening OH defined therein. The light-emitting opening OH in the pixel-defining film PDL exposes at least a portion of the first electrode EL1. Light-emitting regions EA1, EA2, and EA3 are defined to partially correspond to the first electrode EL1 exposed through the light-emitting opening OH.

The lower panel DP may include the first light-emitting region EA1, the second light-emitting region EA2, and the third light-emitting region EA3. The first light-emitting region EA1, the second light-emitting region EA2, and the third light-emitting region EA3 may be separated by the pixel-defining film PDL. The first light-emitting region EA1, the second light-emitting region EA2, and the third light-emitting region EA3 may respectively correspond to the first pixel region PXA-R, the second pixel region PXA-G, and the third pixel region PXA-B. That is, the first to third light-emitting regions EA1, EA2, and EA3 may be alternatively arranged in the first direction DR1. The first to third light-emitting regions EA1, EA2, and EA3 may have a stripe-like shape.

Meanwhile, the wording, "corresponding" herein may mean that, when viewed in the thickness direction DR3 of the display device DD, two components overlap, but is not limited to the two components having the same area. The first light-emitting region EA1, the second light-emitting region EA2, and the third light-emitting region EA3 may be arranged in a row.

The light-emitting regions EA1, EA2, and EA3 may overlap the pixel regions PXA-R, PXA-G, and PXA-B. When viewed on a plane, the areas of the pixel regions PXA-R, PXA-G, and PXA-B may be respectively larger than the areas of the light-emitting regions EA1, EA2, and EA3 separated by the pixel-defining film PDL. However, this is merely an example, and the present disclosure is not limited thereto. The respective areas of the pixel regions PXA-R, PXA-G, and PXA-B may be substantially equal to the areas of the light-emitting regions EA1, EA2, and EA3 separated by the pixel-defining film PDL.

In the light-emitting element EMD, the first electrode EL1 may be located on the circuit layer DP-CL. The first electrode EL1 may be an anode or a cathode. In addition, the first electrode EL1 may be a pixel electrode. The first electrode EL1 may be a transmissive electrode, a transflective electrode, or a reflective electrode.

The hole control layer HTR may be located between the first electrode EL1 and the light-emitting layer EML. The hole control layer HTR may include at least one of a hole injection layer, a hole transport layer, or an electron-blocking layer. The hole control layer HTR may be located as a common layer so as to overlap the entirety of the light-emitting regions EA1, EA2, and EA3, as well as the pixel-defining film PDL that separates the light-emitting regions EA1, EA2, and EA3. However, the present disclosure is not limited thereto, and the hole control layer HTR may be provided after being patterned, so that the hole control layer HTR is separately located corresponding to each of the light-emitting regions EA1, EA2, and EA3.

The light-emitting layer EML may be located on the hole control layer HTR. The light-emitting layer EML according to one or more embodiments may be provided as a common layer to overlap the entirety of the light-emitting regions EA1, EA2, and EA3 and to overlap the pixel-defining film PDL that separates the light-emitting regions EA1, EA2, and EA3. In one or more embodiments, the light-emitting layer EML may emit blue light. In the display device DD according to one or more embodiments, blue light may be source light.

The light-emitting layer EML may overlap the entirety of the hole control layer HTR and the electron control layer ETR. However, the present disclosure is not limited thereto, and in one or more embodiments, the light-emitting layer EML may be located in the light-emitting opening OH. That is, the light-emitting layer EML may be separately formed so as to correspond to each of the light-emitting regions EA1, EA2, and EA3 separated by the pixel-defining film PDL. The light-emitting layer EML separately formed to correspond to each of the light-emitting regions EA1, EA2, and EA3 may all emit blue light or the light-emitting regions EA1, EA2, and EA3 respectively emit light having different wavelength ranges.

The light-emitting layer EML may have a single layer formed of a single material, a single layer formed of a plurality of different materials, or a multi-layered structure having a plurality of layers formed of a plurality of different materials. The light-emitting layer EML may include a fluorescent or phosphorescent material. In the light-emitting element according to one or more embodiments, the light-emitting layer EML may include, as a light emitting material, an organic light-emitting material, a metal-organic complex, or quantum dots, etc.

The electron control layer ETR may be located between the light-emitting layer EML and a second electrode EL2. The electron control layer ETR may include at least one of an electron injection layer, an electron transport layer, or a hole-blocking layer. The electron control layer ETR may be located as a common layer so as to overlap the entirety of the light-emitting regions EA1, EA2, and EA3 and the pixel-defining film PDL that separates the light-emitting regions EA1, EA2, and EA3. However, the present disclosure is not limited thereto, and the electron control layer ETR may be provided after being patterned so that the electron control layer ETR is separately located corresponding to each of the light-emitting regions EA1, EA2, and EA3.

The second electrode EL2 is provided on the electron control layer ETR. The second electrode EL2 may be a common electrode. The second electrode EL2 may be a cathode or an anode, but the present disclosure is not limited thereto. For example, when the first electrode EL1 is an anode, the second electrode EL2 may be a cathode, and when the first electrode EL1 is a cathode, the second electrode EL2 may be an anode. The second electrode EL2 may be a transmissive electrode, a transflective electrode, or a reflective electrode.

The encapsulation layer TFE may be located on the light-emitting element EMD. For example, in one or more embodiments, the encapsulation layer TFE may be located on the second electrode EL2. Also, when the light-emitting element EMD includes a capping layer, the encapsulation layer TFE may be located on the capping layer. The encapsulation layer TFE may include at least one organic layer and at least one inorganic layer, and the inorganic layer and the organic layer may be alternately located. The encapsulation layer TFE may protect the light-emitting element layer DP-ED against moisture and/or oxygen, and may function to reduce or prevent impurities, such as dust particles from entering the light-emitting element layer DP-ED.

The encapsulation layer TFE may include at least one inorganic layer including at least one of silicon nitride, silicon oxynitride, or silicon oxide. In addition, the inorganic layer may include titanium oxide, aluminum oxide, or the like.

The encapsulation layer TFE may include an organic layer located between the inorganic layers. The organic layer may include an organic polymer material formed of an acrylate-based resin or the like. However, the present disclosure is not limited thereto.

The light control layer CCL may be located on the encapsulation layer TFE. The light control layer CCL may be directly located on the encapsulation layer TFE. The light control layer CCL may be located on the uppermost part of the lower panel DP. However, this is merely an example, and the present disclosure is not limited thereto. For example, the lower panel DP according to one or more embodiments may further include an adhesive layer or other functional layers located above the light control layer CCL.

The light control layer CCL may include division patterns BMP and light control parts CCP1, CCP2, and CCP3. The light control parts CCP1, CCP2, and CCP3 included in the light control layer CCL may be spaced apart from each other. The light control parts CCP1, CCP2, and CCP3 may be spaced apart from each other by the division patterns BMP. The light control parts CCP1, CCP2, and CCP3 may be located in openings BW-OH1, BW-OH2, and BW-OH3 defined in the division patterns BMP. However, the present disclosure is not limited thereto. FIGS. 5A and 5B illustrate that the division patterns BMP do not overlap the light control parts CCP1, CCP2, and CCP3, but the edges of the light control parts CCP1, CCP2, and CCP3 may overlap at least a portion of the division patterns BMP.

The division patterns BMP may each include a material having a transmittance of a value (e.g., a predetermined value). For example, the division patterns BMP may include a black coloring agent for light blocking. The division patterns BMP may include a black pigment or black dye mixed in a base resin. In one or more embodiments, the black coloring agent may include carbon black, or may include a metal, such as chromium or an oxide thereof.

The light control parts CCP1, CCP2, and CCP3 may convert a wavelength of light provided from the display element layer DP-ED, or may transmit the light without wavelength conversion of the provided light. The light control parts CCP1, CCP2, and CCP3 may be formed by an inkjet process. A liquid ink composition may be provided in the openings BW-OH1, BW-OH2, and BW-OH3, and the provided ink composition may be polymerized through a thermal curing process or a light curing process, so that the light control parts CCP1, CCP2, and CCP3 may be formed. That is, the shapes of the openings BW-OH1, BW-OH2, and BW-OH3 may respectively correspond to shapes of the light control parts CCP1, CCP2, and CCP3.

The light control layer CCL may include a first light control part CCP1 including a first quantum dot for converting first-color light provided from the light-emitting element EMD into second-color light, the second light control part CCP2 including a second quantum dot for converting the first-color light into a third-color light, and the third light control part CCP3 that transmits the first-color light.

In one or more embodiments, the first light control part CCP1 may provide red light that is the second-color light, and the second light control part CCP2 may provide green light that is the third-color light. The third light control part CCP3 may provide blue light by transmitting the blue light, which is the first-color light, and which is provided from the light-emitting element EMD. For example, the first quantum dot may be a red quantum dot, and the second quantum dot may be a green quantum dot.

Referring to FIG. 4, when viewed on a plane, the first light control part CCP1 may include a first portion PT1, and a second portion PT2 extending from the first portion PT1 in the second direction DR2. The first portion PT1 and the second portion PT2 may each have a quadrilateral shape, but the shapes of the first portion PT1 and the second portion PT2 are not limited thereto. For example, the second portion PT2 may have a rectangular shape extending in the first direction DR1.

The second portion PT2 may extend in the second direction DR2 from one side of the first portion PT1. The second portion PT2 may have a smaller width than the first portion PT1 in the first direction DR1.

One side of the first portion PT1 extending in the second direction DR2, and one side of the second portion PT2 extending in the second direction DR2, may be located on the same line. According to this structure, the first light control part CCP1 may have a vertically inverted "L"-shape. For example, in FIG. 4, one side of the first portion PT1 may represent the left side of the first portion PT1, and one side of the second portion PT2 may represent the left side of the second portion PT2.

Meanwhile, a first opening BW-OH1 may have a shape corresponding to the first light control part CCP1. That is, the first opening BW-OH1 may include a portion corresponding to the first portion PT1 and a portion corresponding to the second portion PT2. The portion corresponding to the first portion PT1 of the first opening BW-OH1 may be a portion on which ink is applied during inkjet printing.

For example, referring to FIG. 6, the inkjet printing method may be performed by an inkjet printing apparatus including a head unit HAD and a plurality of nozzle units NOZ. An inkjet printing apparatus may be located above the division patterns BMP. For example, the inkjet printing apparatus may be located above the first opening BW-OH1 defined in the division patterns BMP. The inkjet printing apparatus may apply a light control part ink INK in the first opening BW-OH1 through the plurality of nozzle units NOZ. The light control part ink INK may include a material that forms the first light control part CCP1 when cured. In one or more embodiments, because the first opening BW-OH1 includes the first portion PT1 that is wider than the second portion PT2 in the first direction DR1, the first light control part CCP1 may be formed through the inkjet printing apparatus including the plurality of nozzle units NOZ. Accordingly, it is possible to reduce the time taken to manufacture the first light control part CCP1 according to one or more embodiments.

The above description of the method of manufacturing the first light control part CCP1 through the inkjet printing method may be similarly applied to a method of manufacturing the second light control part CCP2 through the inkjet printing method. That is, like the first light control part CCP1, it is also possible to reduce the time taken to manufacture the second light control part CCP2 according to one or more embodiments.

The first light control part CCP1 may include a first overlap portion S-CCP11 overlapping the first light-emitting region EA1, and a first non-overlap portion S-CCP12 not overlapping the first light-emitting region EA1. The first overlap portion S-CCP11 may convert blue light emitted from the first light-emitting region EA1 into red light. The first non-overlap portion S-CCP12 may be a portion that is not reached by light emitted from the first light-emitting region EA1. The first non-overlap portion S-CCP12 may correspond to a first non-light-emitting region NPXA-R where light is not emitted. Accordingly, in the first light control part CCP1, light is only emitted from the first overlap portion S-CCP11.

Referring to FIG. 4, when viewed on a plane, the second light control part CCP2 may include a third portion PT3, and a fourth portion PT4 extending from the third portion PT3 in the second direction DR2. The third portion PT3 and the fourth portion PT4 may each have a quadrilateral shape, but the shapes of the third portion PT3 and the fourth portion PT4 are not limited thereto. For example, the third portion PT3 may have a rectangular shape extending more in the first direction DR1.

The fourth portion PT4 may extend in the second direction DR2 from one side of the third portion PT3. The fourth portion PT4 may have a smaller width than the third portion PT3 in the first direction DR1.

One side of the third portion PT3 extending in the second direction DR2, and one side of the fourth portion PT4 extending in the second direction DR2, may be located on the same line. According to this structure, the second light control part CCP2 may have a horizontally inverted "L"-shape. For example, in FIG. 4, one side of the third portion PT3 may represent the left side of the third portion PT3, and one side of the fourth portion PT4 may represent the left side of the fourth portion PT4.

Meanwhile, a second opening BW-OH2 may have a shape corresponding to the second light control part CCP2. That is, the second opening BW-OH2 may include a portion corresponding to the third portion PT3 and a portion corresponding to the fourth portion PT4. The portion corresponding to the third portion PT3 of the second opening BW-OH2 may be a portion on which ink is applied during inkjet printing.

The second light control part CCP2 may include a second overlap portion S-CCP21 overlapping the second light-emitting region EA2, and a second non-overlap portion S-CCP22 not overlapping the second light-emitting region EA2. The second overlap portion S-CCP21 may convert blue light emitted from the second light-emitting region EA2 into green light. The second non-overlap portion S-CCP22 may be a portion at which light emitted from the second light-emitting region EA2 does not reach. The second non-overlap portion S-CCP22 may correspond to the second non-light-emitting region NPXA-G where light is not emitted. Accordingly, in the second light control part CCP2, light is only emitted from the second overlap portion S-CCP21.

Meanwhile, first non-overlap portion S-CCP12 and the second non-overlap portion S-CCP22 may face each other in the second direction DR2. Meanwhile, the first non-overlap portion S-CCP12 and the second non-overlap portion S-CCP22 may be spaced apart from each other in the second direction DR2. The first overlap portion S-CCP11 and the second overlap portion S-CCP21 may face each other in the first direction DR1. The first overlap portion S-CCP11 and the second overlap portion S-CCP21 may be spaced apart from each other in the first direction DR1.

Because the display device DD according to one or more embodiments may include the first light control part CCP1 including the first non-overlap portion S-CCP12 and the second light control part CCP2 including the second non-overlap portion S-CCP22, light may be emitted only through the first overlap portion S-CCP11 and the second overlap portion S-CCP21. Furthermore, the first to third pixel regions PXA-R, PXA-G, and PXA-B may have a stripe-like shape, and the display quality of the display device DD may be improved.

When viewed on a plane, the third light control part CCP3 may have a shape corresponding to the third pixel region PXA-B. The third light control part CCP3 may have a shape corresponding to a third opening BW-OH3. When viewed on a plane, the third opening BW-OH3 may have a smaller area than the third light-emitting region EA3.

The quantum dots included the light control layer CCL may each have a core-shell structure, and the core of the quantum dot may be selected from a II-VI group compound, a III-VI group compound, a I-III-VI group compound, a III-V group compound, and III-II-V group compound, a I IV-VI group compound, a IV group element, a IV group compound, and a combination thereof.

The II-VI group compound may be selected from the group consisting of: a binary compound selected from the group consisting of CdSe, CdTe, CdS, ZnS, ZnSe, ZnTe, ZnO, HgS, HgSe, HgTe, MgSe, MgS, or a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS or a mixture thereof; or a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, or a mixture thereof.

The III-VI group compound may include a binary compound, such as $In_2S_3$, $In_2Se_3$, etc., a ternary compound, such as $InGaS_3$, $InGaSe_3$, etc., or any combination thereof.

The I-III-VI group compound may be selected from: a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, or a mixture thereof; or a quaternary compound, such as $AgInGaS_2$, $CuInGaS_2$, or the like.

The III-V group compound may be selected from the group consisting of: a binary compound selected from the group consisting of GaN, GaP, GaAs, GaSb, AlN, AlP, AlAs, AlSb, InN, InP, InAs, InSb, or a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, or a mixture thereof; or a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof. Meanwhile, the III-V group compound may further include a II group metal. For example, InZnP and the like may be selected as the III-II-V group compound.

The IV-VI group compound may be selected from the group consisting of: a binary compound selected from the group consisting of SnS, SnSe, SnTe, PbS, PbSe, PbTe, or a mixture thereof; a ternary compound selected from the group consisting of SnSeS, SnSeTe, SnSTe, PbSeS, PbSeTe, PbSTe, SnPbS, SnPbSe, SnPbTe, or a mixture thereof; or a quaternary compound selected from the group consisting of SnPbSSe, SnPbSeTe, SnPbSTe, or a mixture thereof. The IV group element may be selected from the group consisting of Si, Ge, or a mixture thereof. The IV group compound may be a binary compound selected from the group consisting of SiC, SiGe, or a mixture thereof.

In this case, the binary compound, the ternary compound, or the quaternary compound may be present in particles with a uniform concentration, or may be present in the same particles in a state in which the concentrations thereof are distributed partially differently. Also, the quantum dot may have a core/shell structure in which one quantum dot surrounds another quantum dot. The core/shell structure may have a concentration gradient in which the concentration of an element present in the shell decreases toward the core.

In some embodiments, the quantum dot may have a core-shell structure, described above, including a core including the nanocrystal and a shell surrounding the core. The shell of the quantum dot may function as a protective layer for maintaining semiconductor properties by reducing or preventing chemical modification of the core and/or a charging layer for imparting electrophoretic properties to the quantum dot. The shell may have a single- or a multi-layer. Examples of the shell of the quantum dot may include a metal or non-metal oxide, a semiconductor compound, or a combination thereof.

For example, the metal or non-metal oxide may be a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, etc., or a ternary compound, such as $MgAl_2O_4$, $CoFe_2O_4$, $NiFe_2O_4$, $CoMn_2O_4$, etc., but the present disclosure is not limited thereto.

In addition, an example of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the present disclosure is not limited thereto.

The quantum dot may have, in a light-emission wavelength spectrum, a full width of half maximum (FWHM) of about 45 nm or less, for example, about 40 nm or less, or about 30 nm or less, and within this range, color purity or color reproducibility may be improved. In addition, because light emitted through the quantum dots are emitted in all directions, a wide viewing angle may be improved.

Also, the shape of the quantum dot is not particularly limited to a shape generally used in the art, and a spherical shape, a pyramidal shape, or a multi-arm shape, of the quantum dot may be used, or a cubic nanoparticle, a nanotube, a nanowire, a nanofiber, a nanoplate-shaped particle, and the like may be used.

The color of light to be emitted from quantum dots may be adjusted according to a particle size, and thus, the quantum dots may have various light-emission colors, such as blue, red, and green. As the quantum dot has a smaller particle size, light having a shorter wavelength range may be emitted. For example, the particle size of the quantum dots that have the same core, and may emit green light may be smaller than the particle size of the quantum dots that emit red light. Also, the particle size of the quantum dots that have the same core and emit blue light may be smaller than the particle size of the quantum dots that emit green light. However, the present disclosure is not limited thereto, and the particle size of the quantum dots having even the same core may be adjusted according to a shell-forming material and a shell thickness.

Meanwhile, when the quantum dots have various light-emission colors, such as blue, red, and green, the quantum dots having different light-emission colors may respectively have different core materials.

In addition, the light control layer CCL may further include a scatterer. The first light control part CCP1 may include the first quantum dot and the scatterer, the second light control part CCP2 may include the second quantum dot and the scatterer, and the third light control part CCP3 may omit a quantum dot, but may include the scatterer.

The scatterer may be an inorganic particle. For example, the scatterer may include at least one of $TiO_2$, ZnO, $Al_2O_3$, $SiO_2$, or hollow silica. For example, the scatterer may include any one of $TiO_2$, ZnO, $Al_2O_3$, $SiO_2$, or hollow silica, or may be a mixture of two or more materials selected from among $TiO_2$, ZnO, $Al_2O_3$, $SiO_2$, and hollow silica.

The first light control part CCP1, the second light control part CCP2, and the third light control part CCP3 may each include a base resin in which the quantum dots and scatterers are dispersed. In one or more embodiments, the first light control part CCP1 may include the first quantum dot and the scatterer dispersed in the base resin, the second light control part CCP2 may include the second quantum dot and the scatterer dispersed in the base resin, and the third light control part CCP3 may include the scatterer dispersed in the base resin.

The base resin may be a medium in which the quantum dots and the scatterers are dispersed, and may be composed of various resin compositions generally referred to as a binder. For example, the base resin may be an acrylic resin, a urethane-based resin, a silicone-based resin, an epoxy-based resin, or the like. The base resin may be a transparent resin.

The light control layer CCL may further include barrier layers CAP and CAP-T located on top of and/or under the light control part. The barrier layers CAP and CAP-T may function to reduce or prevent infiltration of moisture and/or oxygen (hereinafter, referred to as “moisture/oxygen”). The barrier layers CAP and CAP-T may be located on top of and/or under the light control parts CCP1, CCP2, and CCP3, and thus may block the light control parts CCP1, CCP2, and CCP3 from being exposed to moisture/oxygen.

The barrier layer may include the first barrier layer CAP adjacent to the encapsulation layer TFE, and the second barrier layer CAP-T spaced apart from the encapsulation layer TFE with the light control parts CCP1, CCP2, and CCP3 therebetween. The first barrier layer CAP may cover one surface of each of the light control parts CCP1, CCP2, or CCP3 adjacent to the lower panel DP, and the second barrier layer CAP-T may cover the other surface of each of the light control parts CCP1, CCP2, and CCP3 adjacent to the color filter layer CFL. Additionally, the barrier layers CAP and CAP-T may cover not only the light control parts CCP1, CCP2, and CCP3, but also may cover the division patterns BMP.

The first barrier layer CAP may be located conforming to steps between the division patterns BMP and the light control parts CCP1, CCP2, and CCP3. The second barrier layer CAP-T may cover surfaces of the division patterns BMP and the light control parts CCP1, CCP2, and CCP3, which are adjacent to the color filter layer CFL. The second barrier layer CAP-T may be directly located under a low refractive index layer LR.

The barrier layers CAP and CAP-T may include at least one inorganic layer. That is, the barrier layers CAP and CAP-T may include an inorganic material. For example, the barrier layers CAP and CAP-T may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride or may include a metal foil having light transmittance. For example, the first barrier layer CAP located under the light control parts CCP1, CCP2, and CCP3 may include silicon oxynitride, and the second barrier layer CAP-T located on the top of the light control parts CCP1, CCP2, and CCP3 may include silicon oxide. However, the present disclosure is not limited thereto. Meanwhile, the barrier layers CAP and CAP-T may further include an organic layer. The barrier layers CAP and CAP-T may each have a single- or a multi-layer structure.

In the display device DD according to one or more embodiments, the upper panel OP may include a color filter layer CFL and a second base substrate BL located on the top of the color filter layer CFL. The color filter layer CFL may be located on the light control layer CCL. The color filter layer CFL may be located on the filling layer FML. The color filter layer CFL may include filters CF1, CF2, and CF3. The color filter layer CFL may include the first filter CF1, which transmits second-color light, the second filter CF2, which transmits third-color light, and the third filter CF3, which transmits first-color light. For example, the first filter CF1 may be a red filter, the second filter CF2 may be a green filter, and the third filter CF3 may be a blue filter. The filters CF1, CF2, and CF3 may each include a polymer photosensitive resin and a pigment or dye. The first filter CF1 may include a red pigment or dye, the second filter CF2 may include a green pigment or dye, and the third filter CF3 may include a blue pigment or dye. Meanwhile, the present disclosure is not limited thereto, and the third filter CF3 may not include a pigment or dye. The third filter CF3 may include a polymer photosensitive resin and may not include a pigment or dye. The third filter CF3 may be transparent. The third filter CF3 may be formed of a transparent photosensitive resin.

Also, in one or more embodiments, the first filter CF1 and the second filter CF2 may be yellow filters. The first filter CF1 and the second filter CF2 may be provided integrally without being separated from each other. The first to the third filters CF1, CF2, and CF3 may be located respectively corresponding to the first pixel region PXA-R, the second pixel region PXA-G, and the third pixel region PXA-B. In addition, the first to third filters CF1, CF2, and CF3 may be located respectively corresponding to the first to third light control parts CCP1, CCP2, and CCP3.

Additionally, the plurality of filters CF1, CF2, and CF3, respectively transmitting light having different respective colors may be located to overlap each other to correspond to the peripheral region NPXA located between the pixel regions PXA-R, PXA-G, and PXA-B. In the third direction DR3, which is the thickness direction, the plurality of filters CF1, CF2, and CF3 may be located to overlap each other, so that boundaries between the adjacent pixel regions PXA-R, PXA-G, and PXA-B may be defined. When viewed on a plane, a portion where only the first filter CF1 is located may have a smaller area than an area of the first light control part CCP1. When viewed on a plane, a portion where only the second filter CF2 is located may have a smaller area than an area of the second light control part CCP2. Accordingly, the area of the first pixel region PXA-R may be smaller than the area of the first light control part CCP1, and the area of the second pixel region PXA-G may be smaller than the area of the second light control part CCP2.

Meanwhile, unlike what is illustrated in the drawing, the color filter layer CFL may include a light-blocking portion by which the boundaries are defined between the adjacent filters CF1, CF2, and CF3. The light-blocking portion may be formed from a blue filter, or may be formed by including an organic light-blocking material or an inorganic light-blocking material including a black pigment or a black dye. The color filter layer CFL may include a low refractive index layer LR. The low refractive index layer LR may be located between the light control layer CCL and the filters CF1, CF2, and CF3. The low refractive index layer LR may be located above the light control layer CCL to reduce or prevent the likelihood of the light control parts CCP1, CCP2, and CCP3 being exposed to moisture/oxygen. In addition, the low refractive index layer LR may be located between the light control parts CCP1, CCP2, and CCP3 and the filters CF1, CF2, and CF3, and may serve as an optical functional layer for improving light extraction efficiency, or for reducing or preventing reflected light from being incident onto the light control layer CCL. The low refractive index layer LR may have a lower refractive index than adjacent layers.

The low refractive index layer LR may include at least one inorganic layer. For example, the low refractive index layer LR may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride or include a metal foil having light transmittance. However, the present disclosure is not limited thereto, and the low refractive index layer LR may include an organic layer. The low refractive index layer LR may be formed by including a polymer resin, inorganic particles, and the like. The low refractive index layer LR may be composed of a single layer or a plurality of layers.

Meanwhile, in the display device DD according to one or more embodiments, the filters CF1, CF2, and CF3 of the color filter layer CFL may be directly located on the light control layer CCL. In this case, the low refractive index layer LR may be omitted.

The second base substrate BL may be a member that provides a base surface on which the color filter layer CFL, the light control layer CCL and like are located. The second base substrate BL may be a glass substrate, a metal substrate, a plastic substrate, or the like. However, the present disclosure is not limited thereto, and the second base substrate BL may include an inorganic layer, an organic layer, or a composite material layer. Also, unlike what is illustrated in drawings, the second base substrate BL may be omitted in one or more embodiments.

A display device according to one or more embodiments includes a display element layer having a light-emitting region defined therein, and a light control part located above the display element layer to correspond to the light-emitting region. The light control part includes an overlap portion overlapping the light-emitting region and a non-overlap portion not overlapping the light-emitting region, and has an "L" shape. Because light is not emitted through the non-overlap portion of the light control part in the display device according to one or more embodiments, a pixel region may have a stripe-like shape. Therefore, the display device according to one or more embodiments may have excellent display quality.

A display device according to one or more embodiments includes alight control part having an "L" shape, and may thus reduce the manufacturing time compared to a display device including a light control part extending in one direction.

Although the embodiments of the present disclosure have been described, it is understood that the present disclosure should not be limited to these embodiments, but various changes and modifications may be made by one ordinary skilled in the art within the spirit and scope of the present disclosure as hereinafter claimed.

Therefore, the scope of the present disclosure is not limited to the contents described in the detailed description of the specification, but should be determined by the claims, with functional equivalents thereof to be included therein.

What is claimed is:

1. A display device comprising:

a first base substrate;

a display element layer above the first base substrate, and defining a plurality of light-emitting regions arranged in a first direction;

an encapsulation layer above the display element layer;

a light control layer above the encapsulation layer, and comprising light control parts respectively corresponding to the light-emitting regions;

a homogeneous filling layer above the light control layer;

a second base substrate above the homogeneous filling layer; and a color filter layer between the homogeneous filling layer and the second base substrate, wherein, when viewed on a plane, at least one control part of the light control parts comprises a first portion, and a second portion extending from one side of the first portion in a second direction perpendicular to the first direction, the second portion having a smaller width than the first portion in the first direction.

2. The display device of claim 1, wherein the light control parts comprise:

overlap portions overlapping the light-emitting regions; and non-overlap portions not overlapping the light-emitting regions.

3. The display device of claim 1, wherein the display element layer comprises a light-emitting element configured to emit blue light to the light-emitting regions, and wherein the light control parts comprise a first quantum dot configured to convert the blue light into red light, or a second quantum dot configured to convert the blue light into green light.

4. The display device of claim 1, wherein the light-emitting regions have a stripe-like shape.

5. The display device of claim 1, wherein the light control layer is directly on the encapsulation layer.

6. A display device comprising:

a first base substrate;

a display element layer above the first base substrate, and in which first to third light-emitting regions alternately arranged in a first direction are defined;

an encapsulation layer above the display element layer;

a light control layer above the encapsulation layer;

a homogeneous filling layer above the light control layer;

a second base substrate above the homogeneous filling layer; and a color filter layer between the homogeneous filling layer and the second base substrate, wherein the light control layer comprises;

a division pattern above the display element layer, and in which first to third openings respectively corresponding to the first to third light-emitting regions are defined;

a first light control part in the first opening;

a second light control part in the second opening; and a third light control part in the third opening, and wherein the first light control part comprises a first portion, and a second portion extending from one side of the first portion in a second direction perpendicular to the first direction, the first portion having a smaller width than a width of the second portion in the first direction, and wherein the second light control part comprises a third portion, and a fourth portion extending from one side of the third portion in the second direction perpendicular to the first direction, the third portion having a smaller width than a width of the fourth portion in the first direction.

7. The display device of claim 6, wherein the first light control part comprises a first overlap portion overlapping the first light-emitting region, and a first non-overlap portion not overlapping the first light-emitting region and extending from the first overlap portion in the first direction, and wherein the second light control part comprises a second overlap portion overlapping the second light-emitting region, and a second non-overlap portion not overlapping the second light-emitting region and extending from the second overlap portion in the first direction.

8. The display device of claim 7, wherein the first overlap portion and the second overlap portion face each other in the first direction and are spaced apart from each other in the first direction, and wherein the first non-overlap portion and the second non-overlap portion face each other in the second direction and are spaced apart from each other in the second direction.

9. The display device of claim 6, wherein at least a portion of the first portion and at least a portion of the third portion face each other in the second direction and are spaced apart from each other in the second direction.

10. The display device of claim 6, wherein the display element layer comprises a light-emitting element configured to emit blue light, wherein the first light control part comprises a first quantum dot configured to convert the blue light into red light, wherein the second light control part comprises a second quantum dot configured to convert the blue light into green light, and wherein the third light control part is configured to transmit the blue light.

11. The display device of claim 6, wherein the light control layer is directly on the encapsulation layer.

12. The display device of claim 10, wherein the color filter layer comprises a first filter configured to transmit the red light and above the first light control part, a second filter configured to transmit the green light and above the second light control part, and a third filter configured to transmit the blue light and above the third light control part.

13. An electronic device comprising first to third pixel regions alternately arranged in a first direction, the electronic device comprising:

an upper panel;

a lower panel above the upper panel; and a homogeneous filling layer between the upper panel and the lower panel, wherein the lower panel comprises;

a first base substrate;

a display element layer above the first base substrate and comprising a light-emitting element configured to emit blue light; and a light control layer above the display element layer, and wherein the upper panel comprises a color filter layer above the light control layer, and a second base substrate above the color filter layer, wherein the light control layer comprises:

a division pattern above the display element layer, and in which first to third openings corresponding to the first to third pixel regions are defined;

a first light control part above the first opening;

a second light control part above the second opening; and a third light control part above the third opening, and wherein the first light control part comprises:

a first overlap portion overlapping the first light-emitting region; and a first non-overlap portion not overlapping the first light-emitting region and extending from the first overlap portion in the first direction, and wherein the second light control part comprises:

a second overlap portion overlapping the second light-emitting region and a second non-overlap portion not overlapping the second light-emitting region and extending from the second overlap portion in the first direction.

14. The electronic device of claim 13, wherein, when viewed on a plane, the first opening has a greater area than the first pixel region, and the second opening has a greater area than the second pixel region.

15. The electronic device of claim 13, wherein, when viewed on a plane, the first light control part has a greater area than the first pixel region, and the second light control part has a greater area than the second pixel region.

16. The electronic device of claim 13, wherein the first non-overlap portion and the second non-overlap portion face each other in a second direction crossing the first direction and are spaced apart from each other in the second direction, and wherein the first overlap portion and the second overlap portion face each other in the first direction and are spaced apart from each other in the first direction.

17. The electronic device of claim 13, wherein the first to third pixel regions have a stripe-like shape.

18. The electronic device of claim 13, wherein the first light control part comprises a first quantum dot configured to convert the blue light into red light, wherein the second light control part comprises a second quantum dot configured to convert the blue light into green light, wherein the third light control part is configured to transmit the blue light, and wherein the color filter layer is between the light control layer and the second base substrate, and comprises a first filter configured to transmit the red light and above the first light control part, a second filter configured to transmit the green light and above the second light control part, and a third filter configured to transmit the blue light and above the third light control part.

* * * * *